(12) United States Patent
Chockanathan et al.

(10) Patent No.: US 9,728,415 B2
(45) Date of Patent: Aug. 8, 2017

(54) SEMICONDUCTOR DEVICE AND METHOD OF WAFER THINNING INVOLVING EDGE TRIMMING AND CMP

(71) Applicant: STATS ChipPAC, Ltd., Singapore (SG)

(72) Inventors: Vinoth Kanna Chockanathan, Singapore (SG); Xing Zhao, Singapore (SG); Duk Ju Na, Singapore (SG); Chang Bum Yong, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 86 days.

(21) Appl. No.: 14/134,907

(22) Filed: Dec. 19, 2013

(65) Prior Publication Data

US 2015/0179544 A1   Jun. 25, 2015

(51) Int. Cl.

| | | |
|---|---|---|
| *H01L 23/52* | (2006.01) | |
| *H01L 21/306* | (2006.01) | |
| *H01L 21/56* | (2006.01) | |
| *H01L 21/78* | (2006.01) | |
| *H01L 21/304* | (2006.01) | |
| *H01L 21/768* | (2006.01) | |
| *H01L 21/3105* | (2006.01) | |
| *H01L 23/31* | (2006.01) | |

(52) U.S. Cl.
CPC ...... *H01L 21/30625* (2013.01); *H01L 21/304* (2013.01); *H01L 21/56* (2013.01); *H01L 21/565* (2013.01); *H01L 21/76898* (2013.01); *H01L 21/78* (2013.01); *H01L 21/31058* (2013.01); *H01L 21/561* (2013.01); *H01L 23/3114* (2013.01); *H01L 2224/16225* (2013.01); *H01L 2224/48091* (2013.01); *H01L 2224/73265* (2013.01); *H01L 2924/15311* (2013.01)

(58) Field of Classification Search
CPC ............................ H01L 21/568; H01L 21/304
USPC .......................................................... 257/734
See application file for complete search history.

(56) References Cited

U.S. PATENT DOCUMENTS

| | | | |
|---|---|---|---|
| 6,117,778 A | * | 9/2000 | Jones ................ H01L 21/31053 257/E21.244 |
| 6,592,434 B1 | | 7/2003 | Vanell et al. |
| 6,942,548 B2 | | 9/2005 | Wada et al. |
| 8,419,964 B2 | | 4/2013 | Ganesan et al. |

(Continued)

*Primary Examiner* — Sitaramarao S Yechuri
(74) *Attorney, Agent, or Firm* — Robert D. Atkins; Patent Law Group: Atkins and Associates, P.C.

(57) ABSTRACT

A semiconductor device has a substrate including a plurality of conductive vias formed vertically and partially through the substrate. An encapsulant is deposited over a first surface of the substrate and around a peripheral region of the substrate. A portion of the encapsulant around the peripheral region is removed by a cutting or laser operation to form a notch extending laterally through the encapsulant to a second surface of the substrate opposite the first surface of the substrate. A first portion of the substrate outside the notch is removed by chemical mechanical polishing to expose the conductive vias. A second portion of the substrate is removed by backgrinding prior to or after forming the notch. The encapsulant is coplanar with the substrate after revealing the conductive vias. The absence of an encapsulant/base material interface and coplanarity of the molded substrate results in less over-etching or under-etching and fewer defects.

23 Claims, 14 Drawing Sheets

(56) References Cited

U.S. PATENT DOCUMENTS

| | | |
|---|---|---|
| 8,455,879 B2 | 6/2013 | Tanikella et al. |
| 8,506,356 B2 | 8/2013 | Birang et al. |
| 8,778,733 B2 * | 7/2014 | Fuergut ............... H01L 23/492 257/E21.499 |
| 2001/0055856 A1 * | 12/2001 | Tao ..................... H01L 21/78 438/462 |
| 2003/0232502 A1 * | 12/2003 | Asakawa ............. H01L 21/304 438/692 |
| 2007/0017554 A1 * | 1/2007 | Okano ................. B24B 37/345 134/26 |
| 2008/0200037 A1 * | 8/2008 | Tsai ..................... H01L 21/304 438/759 |
| 2010/0081279 A1 * | 4/2010 | Palmer ................... C09G 1/02 438/667 |
| 2012/0074587 A1 * | 3/2012 | Koo ..................... H01L 21/561 257/774 |

* cited by examiner

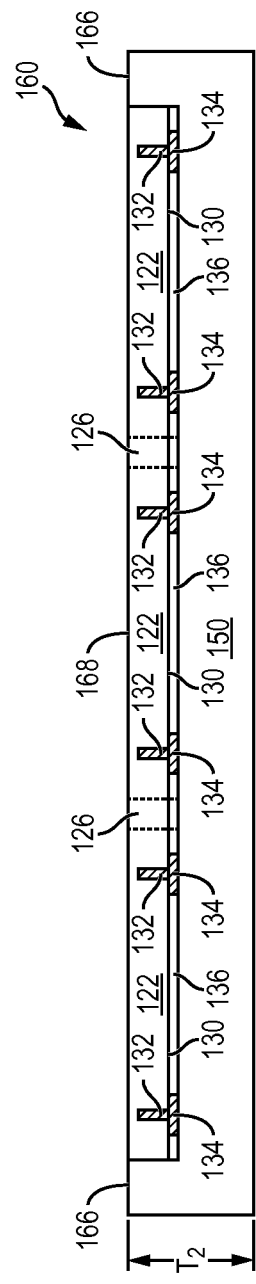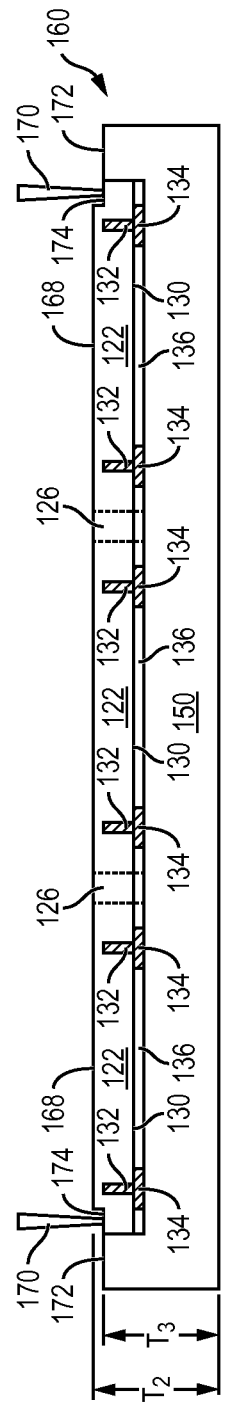

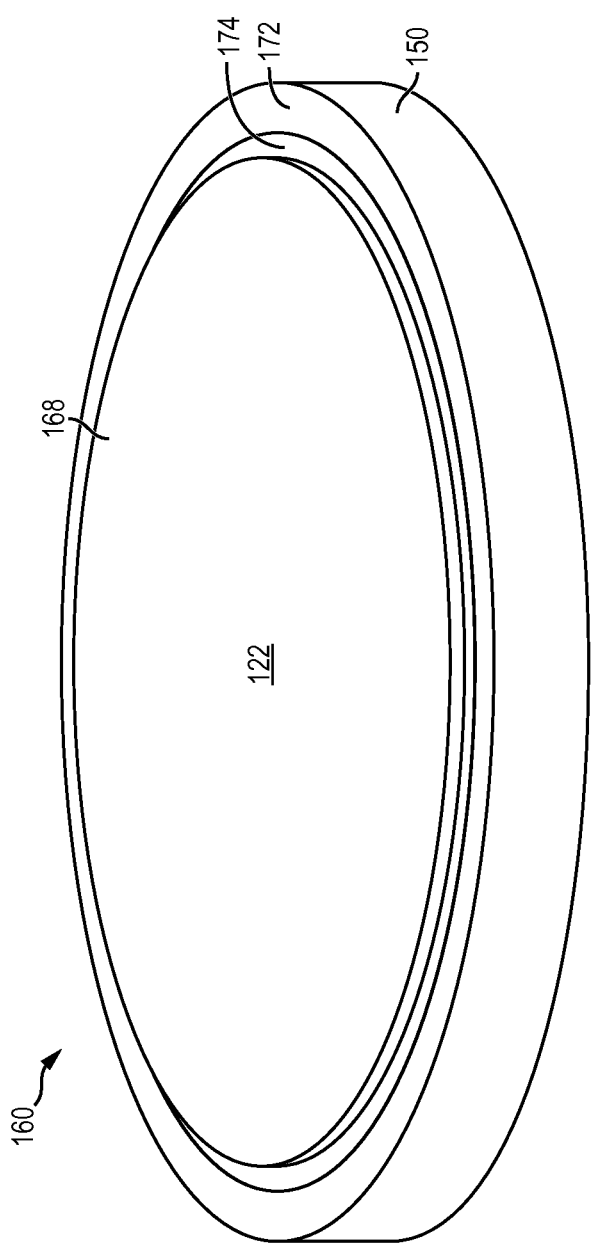
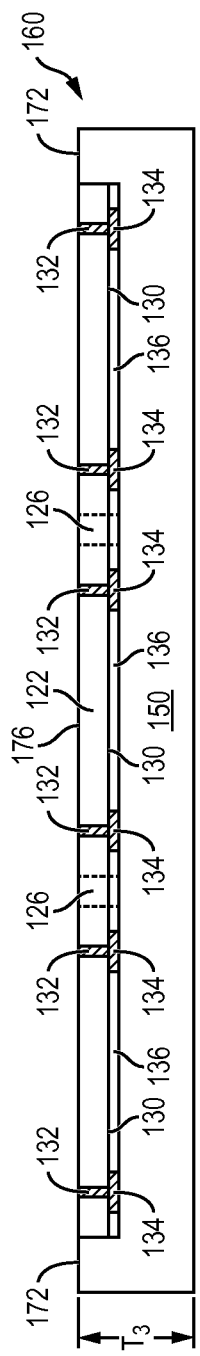

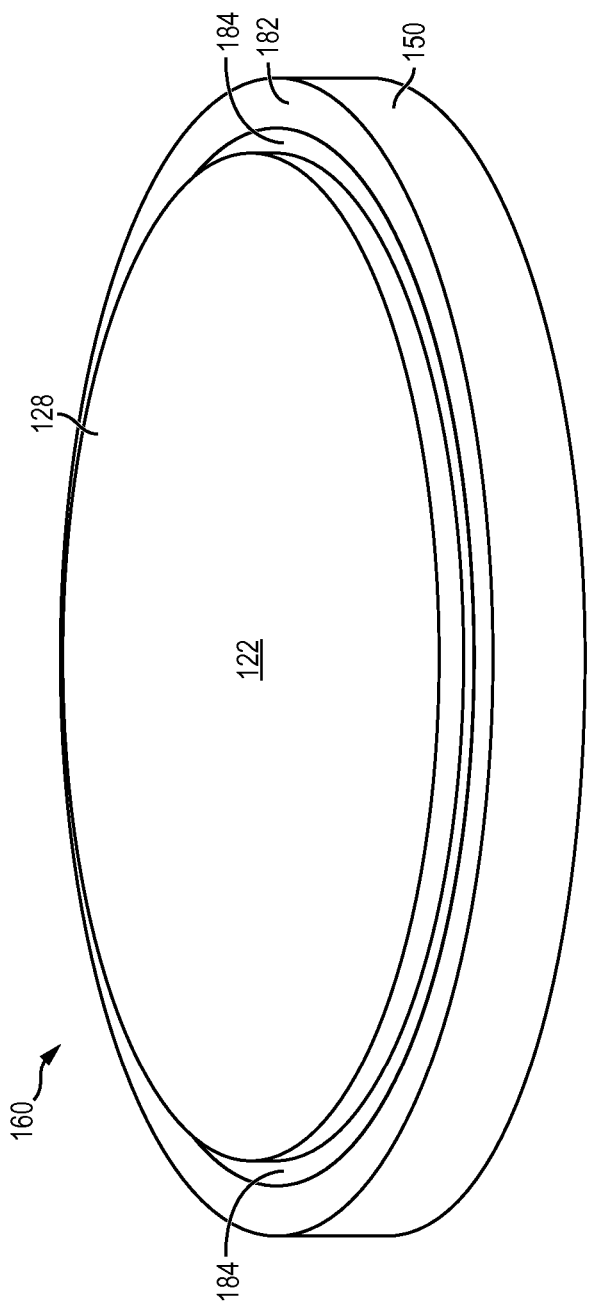
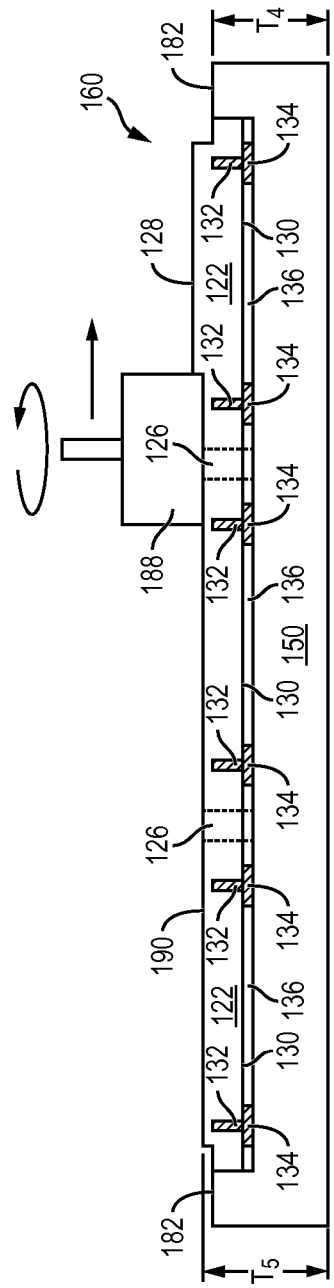
FIG. 9b
FIG. 9c

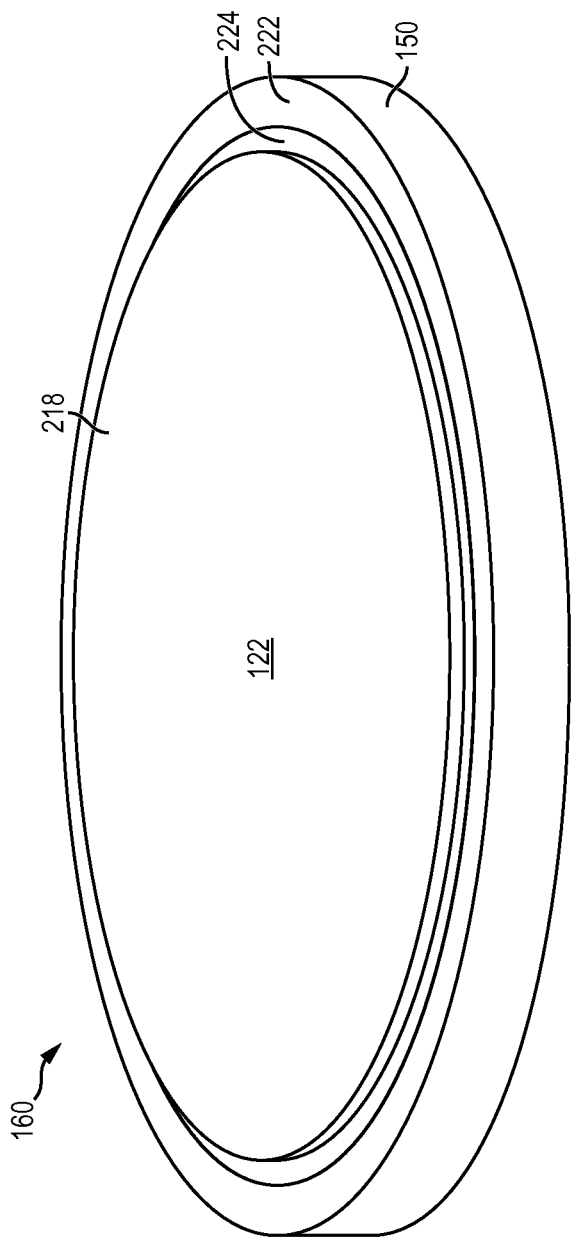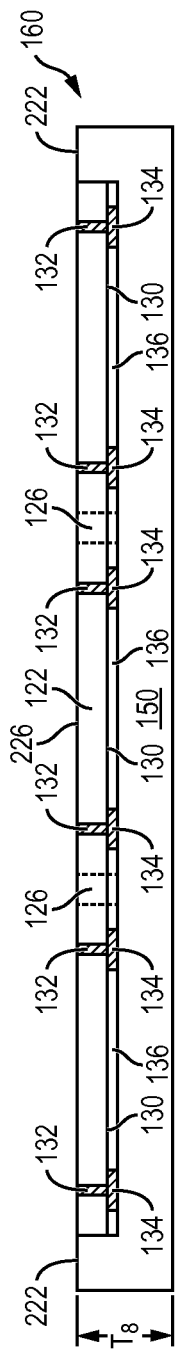

US 9,728,415 B2

SEMICONDUCTOR DEVICE AND METHOD OF WAFER THINNING INVOLVING EDGE TRIMMING AND CMP

FIELD OF THE INVENTION

The present invention relates in general to semiconductor devices and, more particularly, to a semiconductor device and method of wafer thinning involving backgrinding, edge trimming, and CMP to expose conductive vias.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

FIG. 1a shows a molded substrate 10 including semiconductor wafer 12 partially covered by mold compound or encapsulant 14. Semiconductor wafer 12 includes a base semiconductor material with a plurality of semiconductor die and through-silicon vias (TSVs) formed partially through the semiconductor die for vertical electrical interconnection. Semiconductor wafer 12 is partially covered by mold compound 14 with an exposed back surface 16, see FIG. 1b. The TSVs can be revealed or exposed by removing a portion of back surface 16 of the semiconductor material using backside via reveal (BVR) process in order to reduce the connection length, signal delay, and power consumption. The BVR is accomplished by chemical mechanical polishing (CMP) of back surface 16 using chemical slurries in combination with mechanical, physical-contact etching. The CMP process gradually removes semiconductor material from back surface 16 to reveal or expose the TSVs without damaging other portions of semiconductor wafer 12, i.e., without over etching or under etching the semiconductor material.

FIG. 2a shows molded substrate 10 post BVR with the semiconductor material removed to reveal and expose the TSVs through the semiconductor die. An important post-BVR factor is the total thickness variation (TTV) attributed to non-uniform wafer etching or thinning, i.e., the surface area between points 18a-18b of semiconductor wafer 12 may exhibit a different thickness post BVR than area 18c of the wafer adjacent to mold compound 14. FIG. 2b shows that post BVR there is more semiconductor material remaining around the edges 18c of semiconductor wafer 12 than there is remaining between points 18a-18b because the etch rate of mold compound 14 and the semiconductor material in area 18c adjacent to the mold compound is typically less than the etch rate of semiconductor material between points 18a-18b. TTV results a dishing effect which adversely impacts the polish rate at the interface between mold compound 14 and the semiconductor material. TTV can lead to reliability issues as certain TSVs may be revealed earlier or later depending on the wafer thickness. In particular, the TSVs near the peripheral region of semiconductor wafer 12 may not be sufficiently revealed causing electrical shorts or discontinuity.

SUMMARY OF THE INVENTION

A need exists to reduce TTV post BVR to uniformly expose blind conductive TSVs formed in a semiconductor wafer. Accordingly, in one embodiment, the present invention is a method of making a semiconductor device comprising the steps of providing a substrate including a plurality of conductive vias formed partially through the substrate, depositing an encapsulant over a first surface of the substrate and around a peripheral region of the substrate, removing a portion of the encapsulant around the peripheral region to form a notch extending laterally through the encapsulant to a second surface of the substrate opposite the first surface of the substrate, and removing a first portion of the substrate outside the notch to expose the conductive vias.

In another embodiment, the present invention is a method of making a semiconductor device comprising the steps of providing a substrate, depositing an encapsulant over a first surface of the substrate and around a peripheral region of the substrate, removing a portion of the encapsulant around the peripheral region to a second surface of the substrate opposite the first surface of the substrate, and removing a first portion of the substrate to be coplanar with the encapsulant.

In another embodiment, the present invention is a method of making a semiconductor device comprising the steps of providing a substrate, depositing an encapsulant around a peripheral region of the substrate, removing a portion of the encapsulant around the peripheral region to a second surface of the substrate opposite the first surface of the substrate, and removing a first portion of the substrate.

In another embodiment, the present invention is a semiconductor device comprising a substrate including a conductive via extending from a first surface partially through the substrate. An encapsulant is deposited around a peripheral region of the substrate with a notch extending laterally through the encapsulant around the peripheral region to a second surface of the substrate opposite the first surface of the substrate.

BRIEF DESCRIPTION OF THE DRAWINGS

FIGS. 7a-7f illustrate a process of wafer thinning involving a sequence of backgrinding, edge trimming, and CMP to expose conductive TSVs;

FIGS. 9a-9e illustrate a process of wafer thinning involving a sequence of edge trimming, backgrinding, and CMP to expose conductive TSVs; and FIGS. 10a-10g illustrate a process of wafer thinning involving a sequence of backgrinding opposite surfaces, edge trimming, and CMP to expose conductive TSVs.

DETAILED DESCRIPTION OF THE DRAWINGS

Figure 1A:
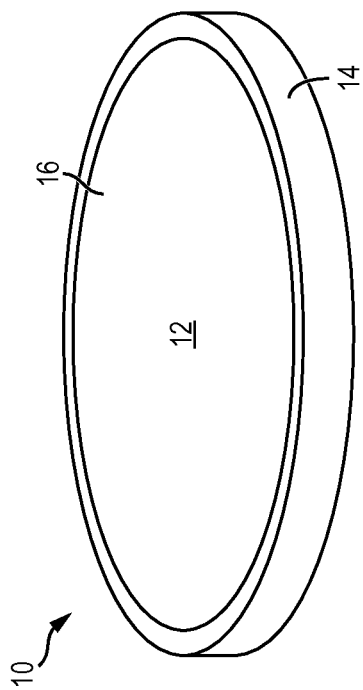
FIGS. 1a-1b illustrate a conventional molded substrate.
Figure 1B:
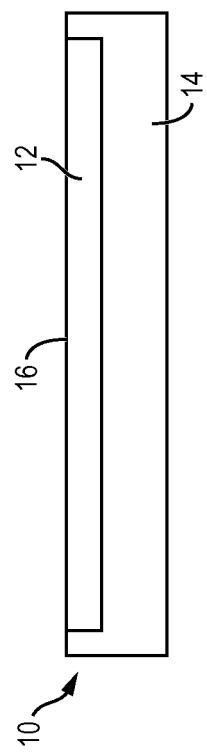
Figure 2A:
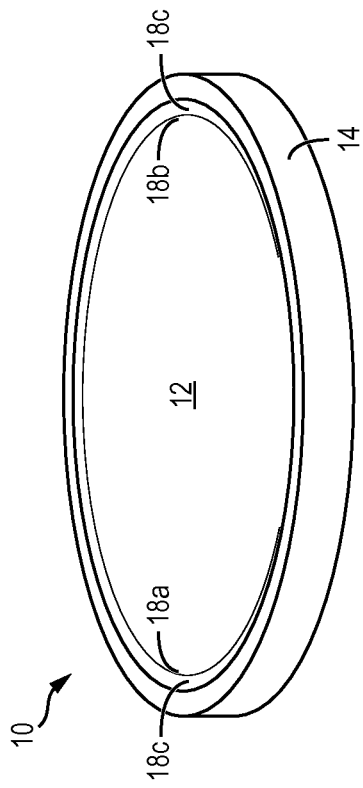
FIGS. 2a-2b illustrate the conventional molded substrate post BVR by CMP.
Figure 2B:
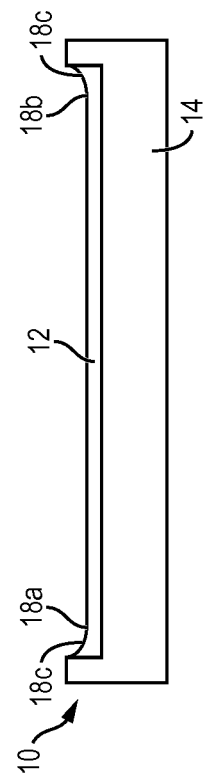

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 3:
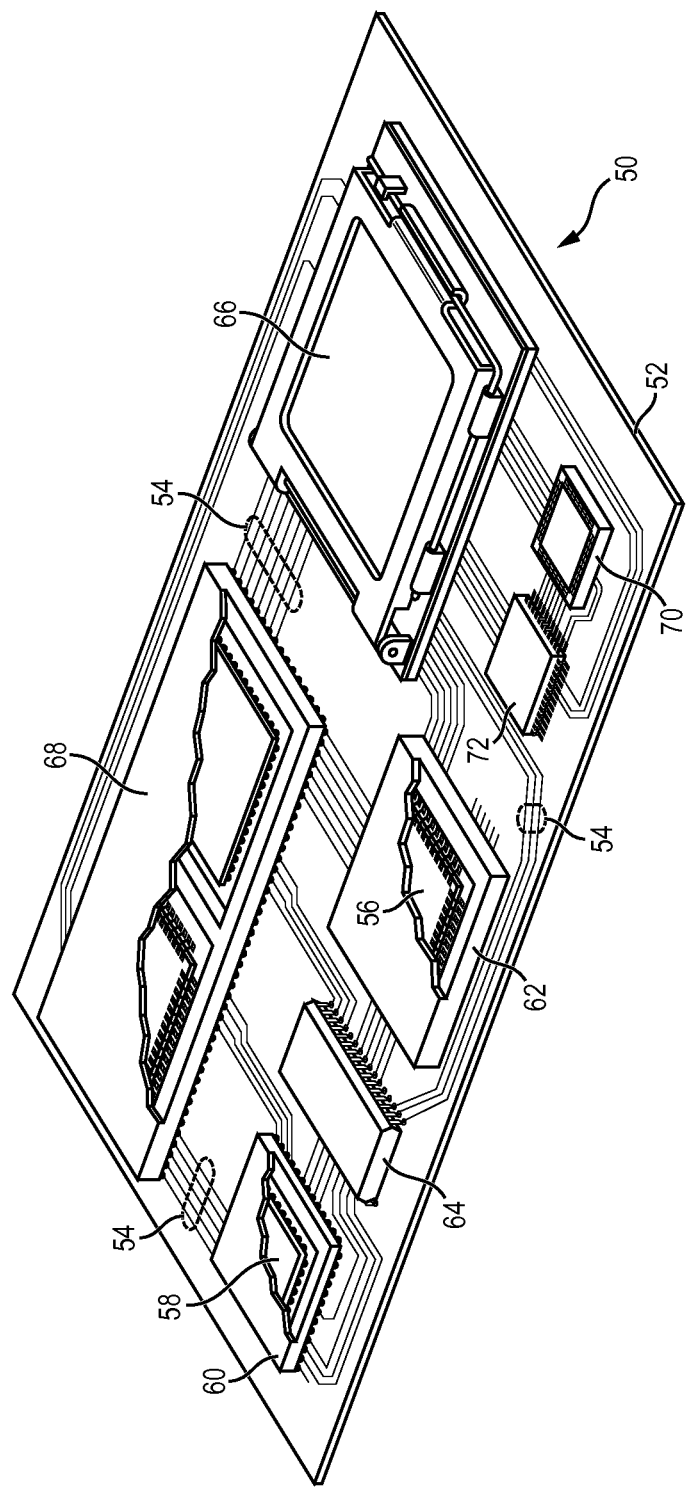
FIG. 3 illustrates a printed circuit board (PCB) with different types of packages mounted to a surface of the PCB.

FIG. 3 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 3 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 3, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 4A:
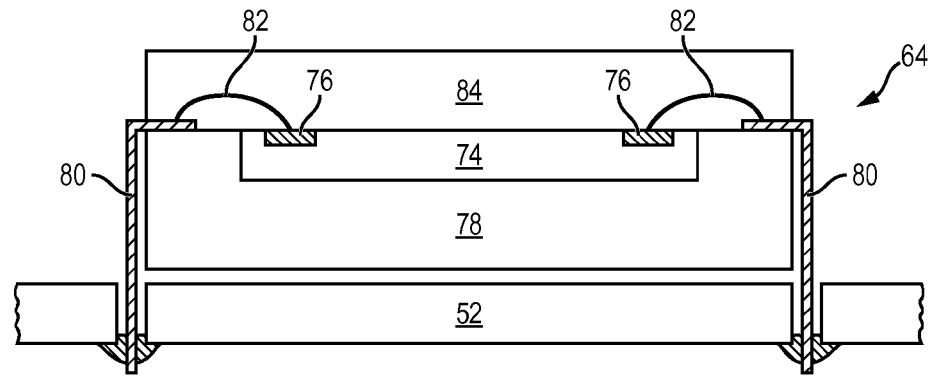
FIGS. 4a-4c illustrate further detail of the representative semiconductor packages mounted to the PCB.
Figure 4B:
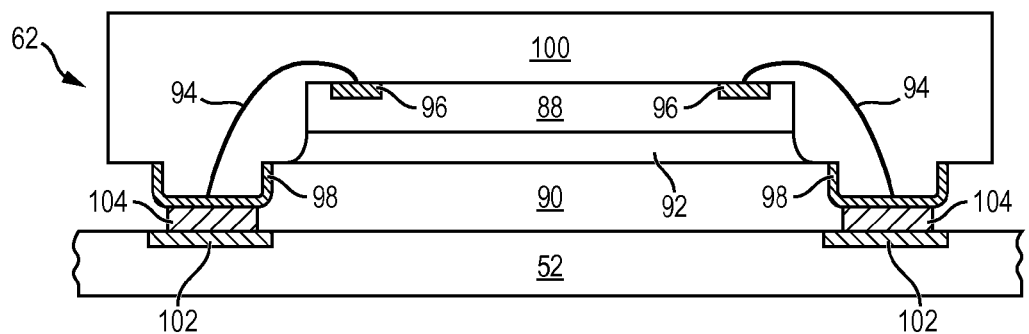
Figure 4C:
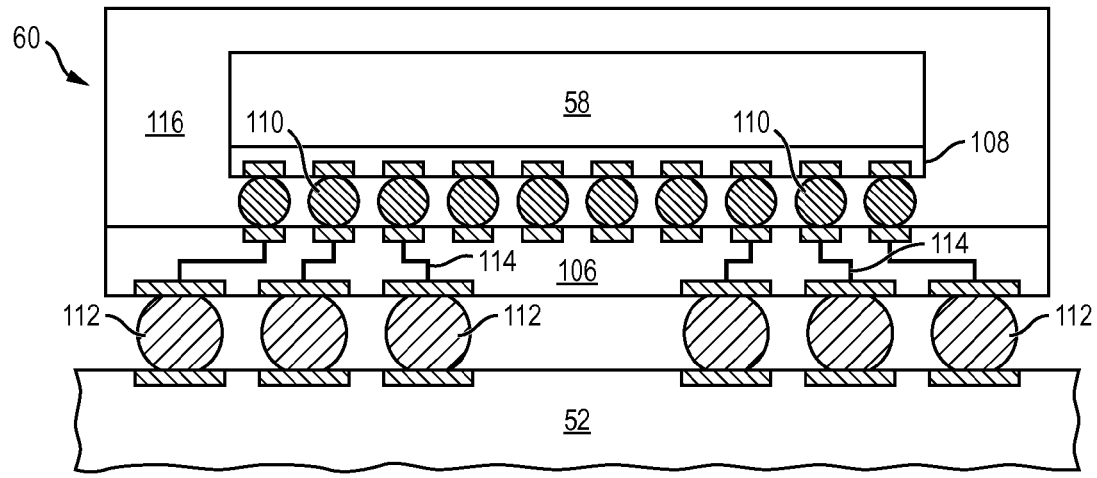

FIGS. 4a-4c show exemplary semiconductor packages. FIG. 4a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 4b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 4c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 5A:
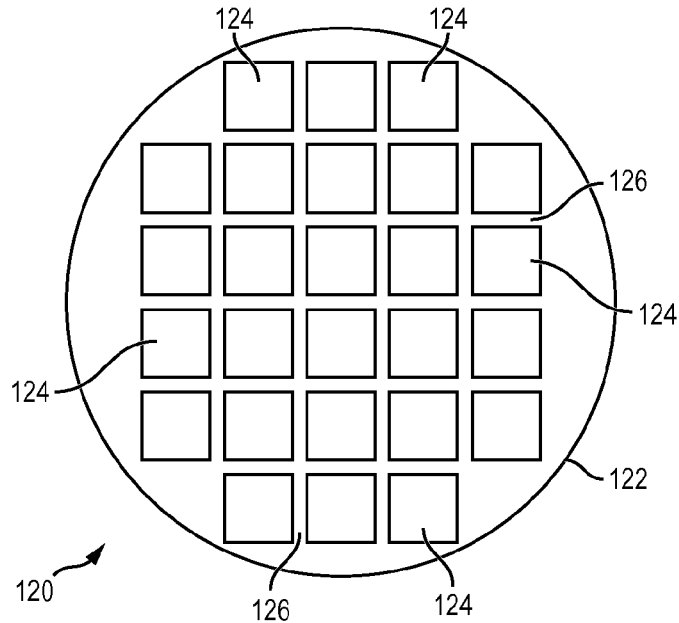
FIGS. 5a-5c illustrate a semiconductor wafer with a plurality of semiconductor die and blind conductive TSVs separated by a saw street.

FIG. 5a shows a semiconductor wafer or substrate 120 with a base material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 100-450 millimeters (mm).

Figure 5B:
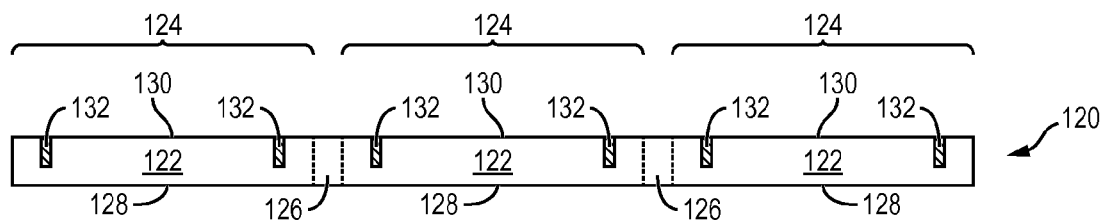

FIG. 5b shows a cross-sectional view of a portion of semiconductor wafer 120. Each semiconductor die 124 has a back or non-active major surface 128 and active major surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

A plurality of vias is formed through active surface 130 by an etching process or laser direct ablation (LDA). The vias extend vertically from active surface 130 partially but not completely through base semiconductor material 122. The vias are filled with Al, Cu, Sn, Ni, Au, Ag, Ti, W, polysilicon, or other suitable electrically conductive material using electrolytic plating, electroless plating process, or other suitable deposition process to form vertical z-direction blind conductive through silicon vias (TSV) 132.

Figure 5C:
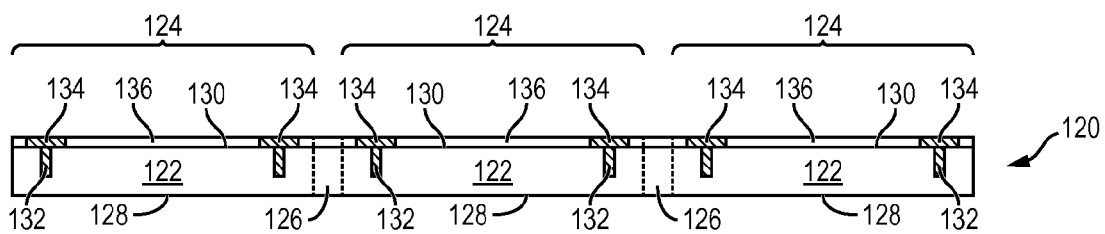

In FIG. 5c, an electrically conductive layer 134 is formed over active surface 130 and blind conductive TSVs 132 using PVD, CVD, electrolytic plating, electroless plating process, or other suitable metal deposition process. Conductive layer 134 can be one or more layers of Al, Cu, Sn, Ni, Au, Ag, or other suitable electrically conductive material. Conductive layer 134 is electrically connected to the circuits on active surface 130.

An insulating or passivation layer 136 is formed over active surface 130 using PVD, CVD, printing, lamination, spin coating, spray coating, sintering or thermal oxidation. The insulating layer 136 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. Alternatively, insulating layer 136 can be formed before conductive layer 134. A portion of insulating layer 136 would be removed by an etching process or LDA to expose active surface 130 and blind conductive TSVs 132 in order to form conductive layer 134. More generally, semiconductor wafer 120 can be any wafer containing semiconductor devices with vertical electrical interconnects, such as blind vertical conductive TSVs 132.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

The active and passive components within semiconductor die 124 undergo testing at the wafer level for electrical performance and circuit function. Each semiconductor die 124 is tested for functionality and electrical parameters using a probe or other testing device. A probe is used to make electrical contact with nodes or conductive layer 134 on each semiconductor die 124 and provides electrical stimuli to the contact nodes. Semiconductor die 124 responds to the electrical stimuli, which is measured and compared to an expected response to test functionality of the semiconductor die. The electrical tests may include circuit functionality, lead integrity, resistivity, continuity, reliability, junction depth, electro-static discharge (ESD), RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 6A:
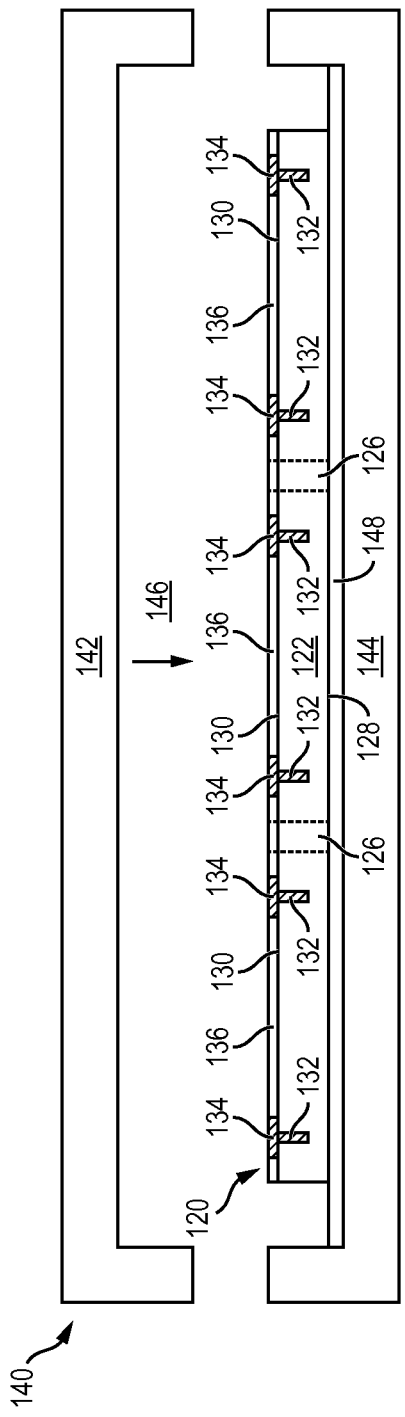
FIGS. 6a-6b illustrate a process of depositing an encapsulant around the semiconductor wafer.
Figure 6B:
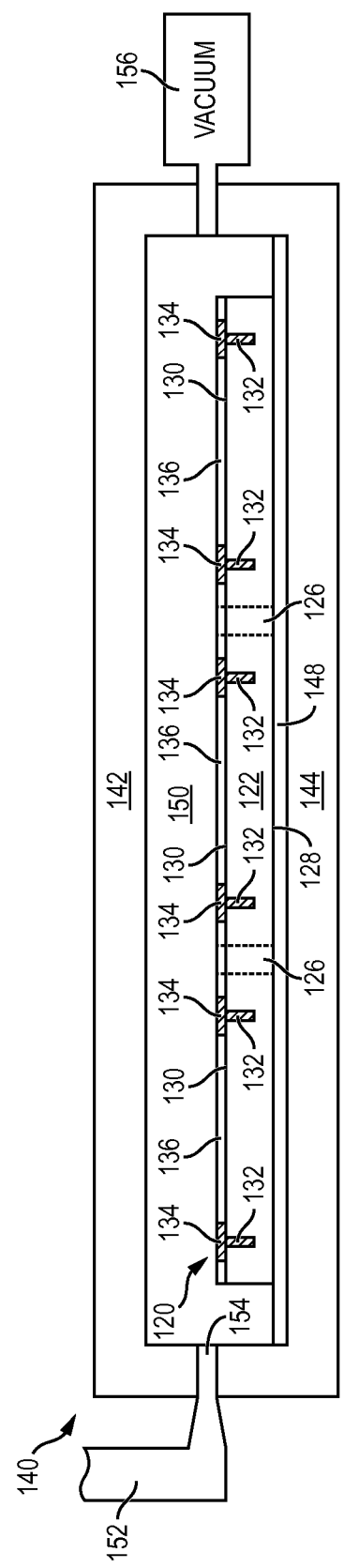

In FIG. 6a, semiconductor wafer 120 is placed in chase mold 140. Chase mold 140 includes an upper mold support 142 and lower mold support 144. Chase mold 140 has a cavity 146 for containing semiconductor wafer 120 and encapsulant or molding compound. Semiconductor wafer 120 is placed over lower mold support 144 with back surface 128 contacting sealing layer 148 to block formation of encapsulant on the back surface of the semiconductor wafer. The upper mold support 142 and lower mold support 144 are brought together to close chase mold 140. In FIG. 6b, a volume of encapsulant or molding compound 150 is injected under an elevated temperature and pressure from mold dispenser 152 through inlet 154 with vacuum assist 156 to cover semiconductor wafer 120. In particular, encapsulant 150 covers insulating layer 136, conductive layer 134, and the side surfaces of semiconductor wafer 120 around a peripheral region of the semiconductor wafer. Encapsulant 150 can be a polymer composite material, such as epoxy resin with filler, epoxy acrylate with filler, or polymer with proper filler. The volume of encapsulant 150 is measured according to the space requirements of chase mold cavity 146 less than the area occupied by semiconductor wafer 120. Encapsulant 150 is evenly dispersed and uniformly distributed under an elevated temperature and pressure within chase mold 140 around semiconductor wafer 120. In one embodiment, the mold injection temperature ranges from 160-190° C. with a molding time of 80-200 seconds. The molding cure temperature ranges from 160-190° C. with a molding cure time of 1-5 hours. Sealing layer 148 blocks formation of encapsulant 150 on back surface 128 of semiconductor wafer 120. Encapsulant 150 is non-conductive and environmentally protects the semiconductor device from external elements and contaminants.

Figure 7A:
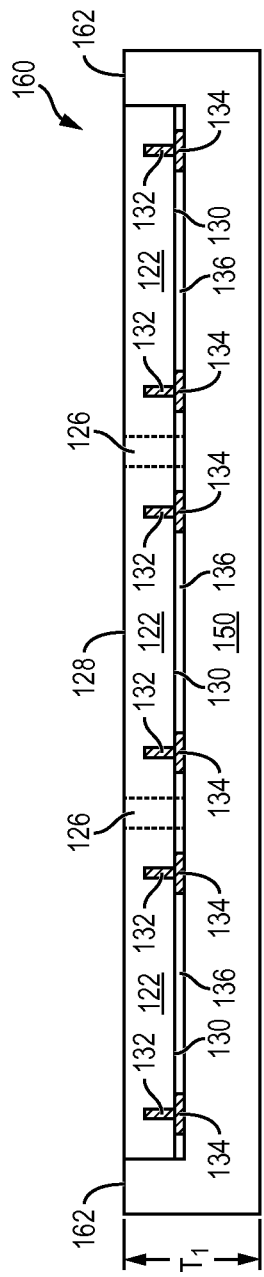

FIGS. 7a-7f illustrate a wafer thinning process involving backgrinding, edge trimming, and CMP to expose conductive TSVs 132. Molded substrate 160 is removed from chase mold 140, as shown in FIG. 7a. Molded substrate 160 has a thickness $T_1$ depending on the incoming wafer thickness and encapsulant thickness needed for subsequent processing steps. For example, if the incoming wafer thickness is 770 micrometers (µm) and encapsulant thickness is 600 µm, then $T_1$ is 1370 µm. Surface 162 of encapsulant 150 is substantially coplanar with back surface 128 of semiconductor wafer 120 as no encapsulant has been deposited on the back surface during encapsulation in chase mold 140.

Figure 7B:
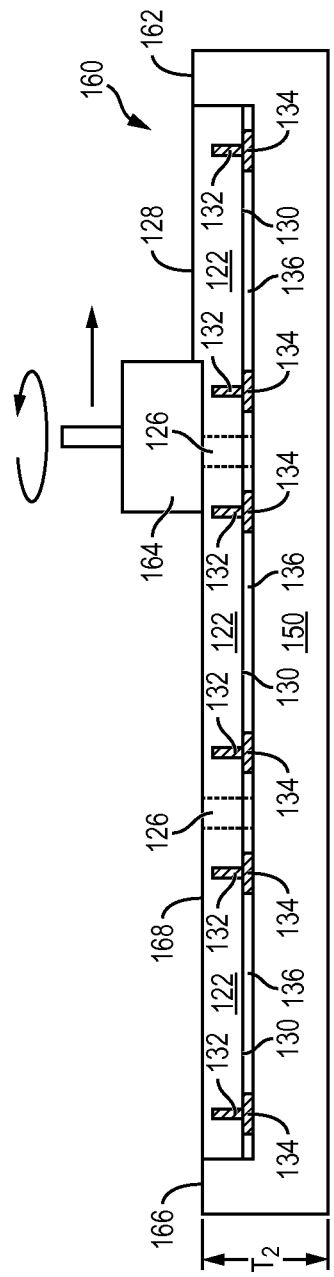

In FIG. 7b, surface 162 and back surface 128 are subjected to a back grinding operation with grinder 164 or other suitable mechanical or etching process to remove a portion of encapsulant 150 and base material 122 and reduce molded substrate 160 to a thickness $T_2$, which is less than thickness $T_1$. In one embodiment, thickness $T_2$ is 720 µm. The removal of encapsulant 150 from surface 162 and base material 122 from back surface 128 is performed as a mechanical process or physical etch process leaving new surface 166 of encapsulant 150 and new back surface 168 of semiconductor wafer 120 uniform across the entire width of molded substrate 160, as shown in FIG. 7c. After the back grinding operation, conductive TSVs 132 remain embedded within base material 122, i.e., not yet exposed. Surface 166 of encapsulant 150 is substantially coplanar with back surface 168 of semiconductor wafer 120.

In FIG. 7d, a portion of encapsulant 150 is removed or pre-trimmed from surface 166 using cutting blade or laser cutting tool 170. In particular, cutting blade 170 removes encapsulant 150 down to new surface 172 to trim the edge of molded substrate 160. In addition, a portion of base material 122 from surface 168 can be removed or pre-trimmed by cutting blade or laser cutting tool 170 to form a notch 174 extending laterally through encapsulant 150 at least to or partially into base material 122. Given notch 174, molded substrate 160 has a thickness $T_2$ at surface 168 and thickness $T_3$ at surface 172, with $T_3$ less than $T_2$. In one embodiment, thickness $T_3$ is 690 µm.

FIG. 7e shows a perspective view of molded substrate 160 with notch 174 cut around a peripheral region of the molded substrate. Notch 174 is cut to remove all of encapsulant 150 from surface 166 down to surface 172 around a peripheral region of molded substrate 160 and to extend laterally into base material 122. The remaining portion of surface 168 of base material 122 outside notch 174 remains elevated above coplanar surface 172 and notch 174. Notch 174 is cut so as to not expose conductive TSVs 132 which remain embedded within base material 122. In other words, conductive TSVs 132 are disposed a sufficient distance from the edge of semiconductor wafer 120 as to permit the cutting of notch 174 to remove all of encapsulant 150 from surface 166 down to surface 172 around a peripheral region of molded substrate 160 and to extend laterally into base material 122 without exposing the conductive TSVs.

In FIG. 7f, a portion of base material 122 is removed from surface 168 outside notch 174 using CMP with chemical slurries in combination with mechanical, physical-contact etching to form new surface 176 of the base material coplanar with surface 172 of encapsulant 150 and further to reveal and expose conductive TSVs 132. The CMP process gradually removes base semiconductor material 122 from back surface 168 to reveal and expose conductive TSVs 132 without damaging the TSVs or other portions of semiconductor wafer 120, i.e., without over etching or under etching the semiconductor material. After CMP, molded substrate 160 has a thickness $T_3$, which is less than thickness $T_2$, across the entire width of the molded wafer. The CMP of base material 122 is a finer removal process than the back grinding operation in FIG. 7b. Conductive TSVs 132 are revealed and exposed from surface 176 of base material 122.

Cutting notch 174 in encapsulant 150 and base material 122 around a peripheral region of molded substrate 160 eliminates the encapsulant/base material interface at the CMP level. That is, the CMP operates to remove a portion of base material 122 away from encapsulant 150, i.e., outside notch 174, because the encapsulant and base material immediately adjacent to the encapsulant have already been removed by formation of notch 174 to the final thickness $T_3$ during the cutting operation of FIG. 7d prior to removing surface 168 by CMP. CMP removes that portion of base material 122 from surface 168 outside node 174 remaining after the cutting operation. The absence of an encapsulant/base material interface at the CMP level by virtue of notch 174 around a peripheral region of molded substrate eliminates or reduces the TTV issues noted in the background where the etch rate of the mold compound and the base material adjacent to the mold compound is typically less than the base material away from the molding compound. Molded substrate 160 exhibits less of or even eliminates the dishing effect from TTV and reduces the reliability issues in which certain conductive TSVs are revealed earlier or later depending on the wafer thickness, as discussed in the background.

Instead, conductive TSVs 132 are revealed during the final CMP stage of a multi-step thinning process involving backgrinding in FIG. 7b, edge trimming in FIG. 7d, and CMP in FIG. 7f to reduce or eliminate TTV particularly at the edges of semiconductor wafer 120. Surface 172 of encapsulant 150 is substantially coplanar with surface 176 of base material 122 following CMP to reveal and expose each conductive TSV 132 with the intended electrical continuity. The absence of an encapsulant/base material interface at the CMP level and coplanarity of the molded substrate results in less over-etching or under-etching and fewer defects.

Figure 8:
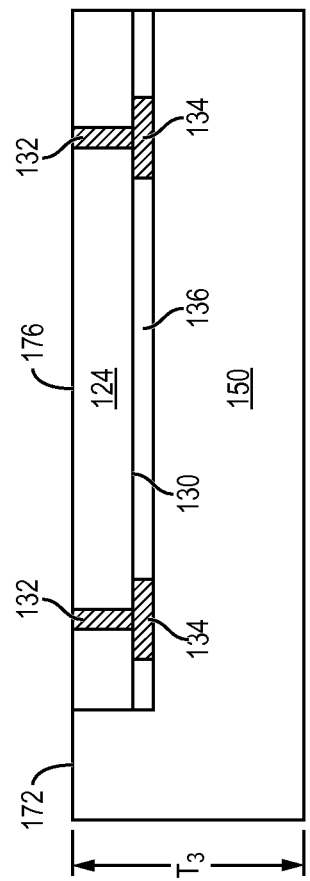
FIG. 8 illustrates a semiconductor die post singulation with exposed conductive TSVs.

Molded substrate 160 is singulated through saw streets 126 using a saw blade or laser cutting tool to separate individual semiconductor die 124. FIG. 8 shows semiconductor die 124 post singulation with conductive TSVs 132 revealed and exposed from surface 176.

FIGS. 9a-9e illustrate a wafer thinning process involving edge trimming, backgrinding, and CMP to expose conductive TSVs 132. Molded substrate 160 from FIG. 7a has a thickness $T_1$. Surface 162 of encapsulant 150 is substantially coplanar with back surface 128 of semiconductor wafer 120 as no encapsulant has been deposited on the back surface during encapsulation in chase mold 140.

Figure 9A:
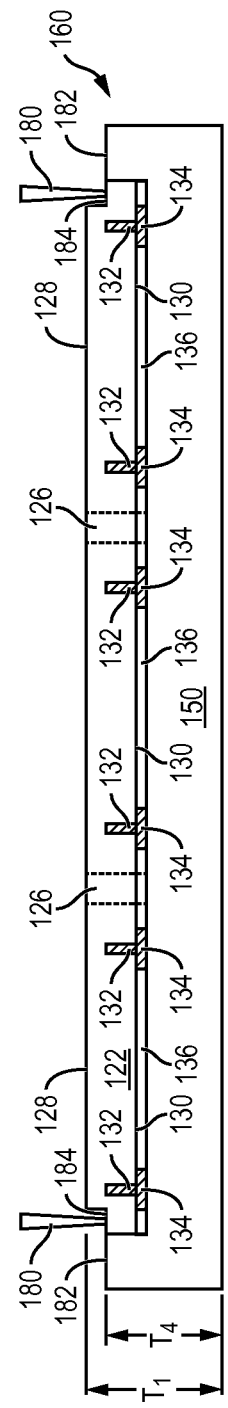

In FIG. 9a, a portion of encapsulant 150 is removed or pre-trimmed from surface 162 using cutting blade or laser cutting tool 180. In particular, cutting blade 180 removes encapsulant 150 down to new surface 182 to trim the edge of molded substrate 160. In addition, a portion of base material 122 from surface 128 can be removed or pre-trimmed by cutting blade or laser cutting tool 180 to form a notch 184 extending laterally through encapsulant 150 at least to or partially into base material 122. Given notch 184, molded substrate 160 has a thickness $T_1$ at surface 128 and thickness $T_4$ at surface 182, with $T_4$ less than $T_1$. In one embodiment, thickness $T_4$ is 690 µm.

FIG. 9b shows a perspective view of molded substrate 160 with notch 184 cut around a peripheral region of the molded substrate. Notch 184 is cut to remove all of encapsulant 150 from surface 162 around a peripheral region of molded substrate 160 and to extend laterally into base material 122. The remaining portion of surface 128 of base material 122 outside notch 184 remains elevated above coplanar surface 182 and notch 184. Notch 184 is cut so as to not expose conductive TSVs 132 which remain embedded within base material 122. In other words, conductive TSVs 132 are disposed a sufficient distance from the edge of semiconductor wafer 120 as to permit the cutting of notch 184 to remove all of encapsulant 150 from surface 162 around a peripheral region of molded substrate 160 and to extend laterally into base material 122 without exposing the conductive TSVs.

Figure 9D:
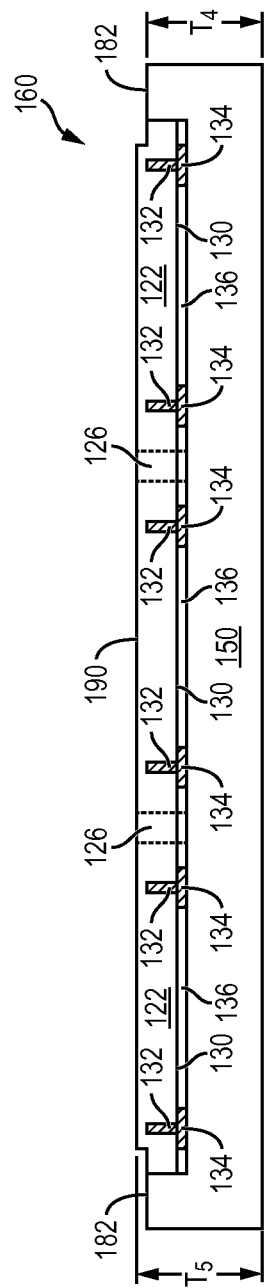

In FIG. 9c, a portion of back surface 128 is subjected to a back grinding operation with grinder 188 or other suitable mechanical or etching process, to remove a portion of base material 122 from surface 128 and reduce molded substrate 160 to a thickness $T_5$ at new surface 190, which is less than thickness $T_1$. In one embodiment, thickness $T_5$ is 720 µm. The removal of base material 122 from back surface 128 is performed as a mechanical process or physical etch process leaving back surface 190 of semiconductor wafer 120 uniform across the entire width of molded substrate 160, as shown in FIG. 9d. After the back grinding operation, conductive TSVs 132 remain embedded within base material 122, i.e., not yet exposed.

Figure 9E:
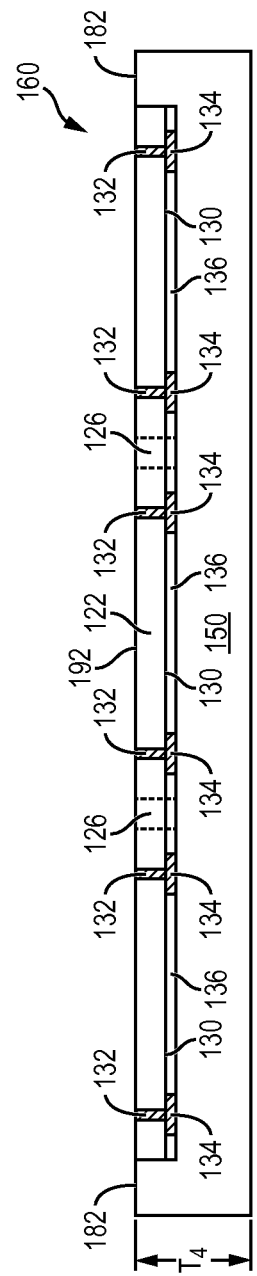

In FIG. 9e, a portion of base material 122 is removed from surface 190 outside notch 184 using CMP with chemical slurries in combination with mechanical, physical-contact etching to form new surface 192 of the base material coplanar with surface 182 of encapsulant 150 and further to reveal and expose conductive TSVs 132. The CMP process gradually removes base semiconductor material 122 from back surface 190 to reveal and expose conductive TSVs 132 without damaging the TSVs or other portions of semiconductor wafer 120, i.e., without over etching or under etching the semiconductor material. After CMP, molded substrate 160 has a thickness $T_4$, which is less than thickness $T_5$, across the entire width of the molded wafer. The CMP of base material 122 is a finer removal process than the back grinding operation in FIG. 9c. Conductive TSVs 132 are revealed and exposed from surface 192 of base material 122.

Cutting notch 184 in encapsulant 150 and base material 122 around a peripheral region of molded substrate 160 eliminates the encapsulant/base material interface at the CMP level. That is, the CMP operates to remove a portion of base material 122 away from encapsulant 150, i.e., outside notch 184, because the encapsulant and base material immediately adjacent to the encapsulant have already been removed by formation of notch 184 to the final thickness $T_4$ during the cutting operation of FIG. 9a prior to removing surface 190 by CMP. CMP removes that portion of base material 122 from surface 190 outside node 184 remaining after the cutting operation and backgrinding operation. The absence of an encapsulant/base material interface at the CMP level by virtue of notch 184 around a peripheral region of molded substrate eliminates or reduces the TTV issues noted in the background where the etch rate of the mold compound and the base material adjacent to the mold compound is typically less than the base material away from the molding compound. Molded substrate 160 exhibits less of or even eliminates the dishing effect from TTV and reduces the reliability issues in which certain conductive TSVs are revealed earlier or later depending on the wafer thickness, as discussed in the background.

Instead, conductive TSVs 132 are revealed during the final CMP stage of a multi-step thinning process involving edge trimming in FIG. 9a, backgrinding in FIG. 9c, and CMP in FIG. 9e to reduce or eliminate TTV particularly at the edges of semiconductor wafer 120. Surface 182 of encapsulant 150 is substantially coplanar with surface 192 of base material 122 following CMP to reveal and expose each conductive TSV 132 with the intended electrical continuity. The absence of an encapsulant/base material interface at the CMP level and coplanarity of the molded substrate results in less over-etching or under-etching and fewer defects.

Molded substrate 160 is singulated through saw streets 126 using a saw blade or laser cutting tool to separate individual semiconductor die 124, similar to FIG. 8.

FIGS. 10a-10g illustrate a wafer thinning process involving backgrinding opposite surfaces, edge trimming, and CMP to expose conductive TSVs 132. Molded substrate 160 in FIG. 10a has a thickness $T_1$ of 1370 µm Surface 162 of encapsulant 150 is substantially coplanar with back surface 128 of semiconductor wafer 120 as no encapsulant has been deposited on the back surface during encapsulation in chase mold 140.

Figure 10A:
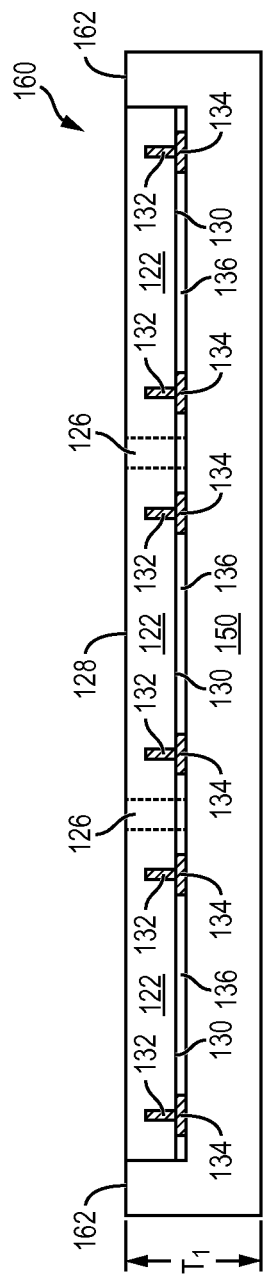
Figure 10B:
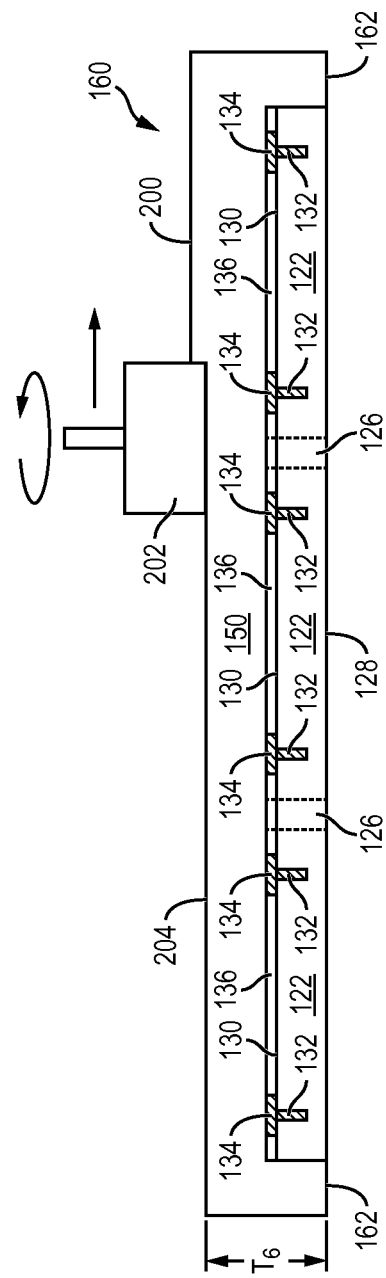

In FIG. 10b, molded substrate 160 is inverted and surface 200 of encapsulant 150, opposite semiconductor wafer 120, is subjected to a back grinding operation with grinder 202 or other suitable mechanical or etching process to remove a portion of encapsulant 150 and reduce the molded substrate to a thickness $T_6$, which is less than thickness $T_1$. In one embodiment, thickness $T_6$ is 920 µm. The backgrinding operation leaves new surface 204 of encapsulant 150 uniform across the entire width of molded substrate 160.

Figure 10C:
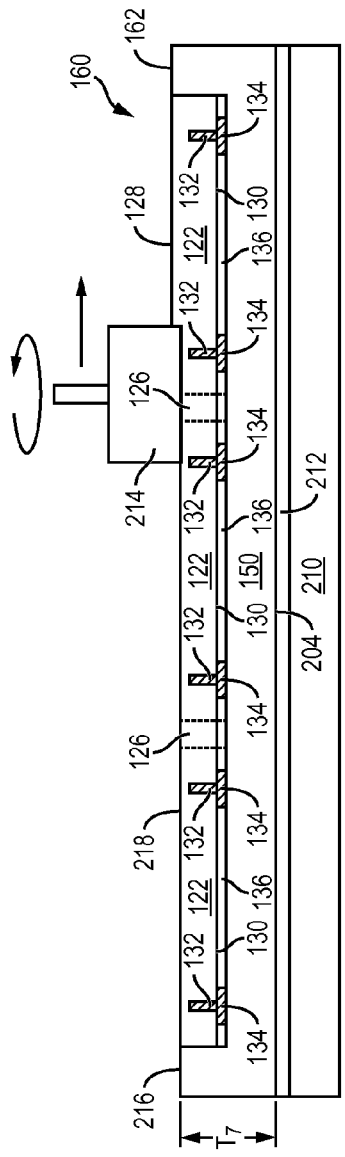

FIG. 10c shows a substrate or carrier 210 containing sacrificial base material such as silicon, polymer, beryllium oxide, or other suitable low-cost, rigid material for structural support. An interface layer or double-sided tape 212 is formed over carrier 210 as a temporary adhesive bonding film or etch-stop layer.

Figure 10D:
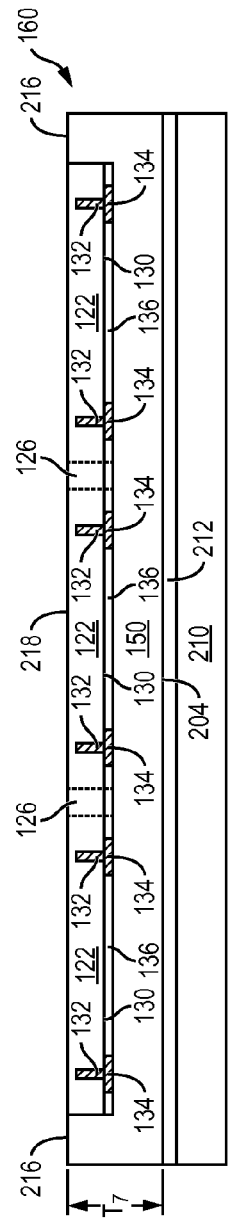

Molded substrate 160 is again inverted and mounted surface 204 to interface layer 212 over carrier 210. Surface 162 and back surface 128 are subjected to a back grinding operation with grinder 214 or other suitable mechanical or etching process to remove a portion of encapsulant 150 and base material 122 and reduce molded substrate 160 to a thickness $T_7$, which is less than thickness $T_6$. In one embodiment, thickness $T_7$ is 270 µm. The removal of encapsulant 150 from surface 162 and base material 122 from back surface 128 is performed as a mechanical process or physical etch process leaving new surface 216 of encapsulant 150 and new back surface 218 of semiconductor wafer 120 uniform across the entire width of molded substrate 160, as shown in FIG. 10d. After the back grinding operation, conductive TSVs 132 remain embedded within base material 122, i.e., not yet exposed. Surface 216 of encapsulant 150 is substantially coplanar with back surface 218 of semiconductor wafer 120.

The backgrinding operation of surface 200 in FIG. 10b could be performed prior to or after the backgrinding operation of surface 162 and surface 128 in FIG. 10c.

Figure 10E:
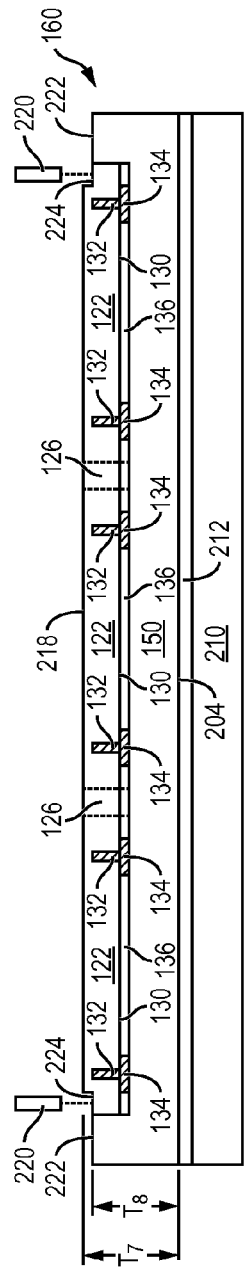

In FIG. 10e, a portion of encapsulant 150 is removed or pre-trimmed from surface 216 using cutting blade or laser cutting tool 220. In particular, cutting blade 220 removes encapsulant 150 down to new surface 222 to trim the edge of molded substrate 160. In addition, a portion of base material 122 from surface 218 can be removed or pre-trimmed by cutting blade or laser cutting tool 220 to form a notch 224 extending laterally through encapsulant 150 at least to or partially into base material 122. Given notch 224, molded substrate 160 has a thickness $T_7$ at surface 218 and thickness $T_8$ at surface 222, with $T_8$ less than $T_7$. In one embodiment, thickness $T_8$ is 240 µm.

FIG. 10f shows a perspective view of molded substrate 160 with notch 224 cut around a peripheral region of the molded substrate. Notch 224 is cut to remove all of encapsulant 150 from surface 216 down to surface 222 around a peripheral region of molded substrate 160 and to extend laterally into base material 122. The remaining portion of surface 218 of base material 122 outside notch 224 remains elevated above coplanar surface 222 and notch 224. Notch 224 is cut so as to not expose conductive TSVs 132 which remain embedded within base material 122. In other words, conductive TSVs 132 are disposed a sufficient distance from the edge of semiconductor wafer 120 as to permit the cutting of notch 224 to remove all of encapsulant 150 from surface 216 down to surface 222 around a peripheral region of molded substrate 160 and to extend laterally into base material 122 without exposing the conductive TSVs.

In FIG. 10g, a portion of base material 122 is removed from surface 218 outside notch 224 using CMP with chemical slurries in combination with mechanical, physical-contact etching to form new surface 226 of the base material coplanar with surface 222 of encapsulant 150 and further to reveal and expose conductive TSVs 132. The CMP process gradually removes base semiconductor material 122 from back surface 218 to reveal and expose conductive TSVs 132 without damaging the TSVs or other portions of semiconductor wafer 120, i.e., without over etching or under etching the semiconductor material. After CMP, molded substrate 160 has a thickness $T_8$ across the entire width of the molded wafer. Conductive TSVs 132 are revealed and exposed from surface 226 of base material 122. Carrier 210 and interface layer 212 are removed by chemical etching, mechanical peeling, CMP, mechanical grinding, thermal bake, UV light, laser scanning, or wet stripping.

Cutting notch 224 in encapsulant 150 and base material 122 around a peripheral region of molded substrate 160 eliminates the encapsulant/base material interface at the CMP level. That is, the CMP operates to remove a portion of base material 122 away from encapsulant 150, i.e., outside notch 224, because the encapsulant and base material immediately adjacent to the encapsulant have already been removed by formation of notch 224 to the final thickness $T_8$ during the cutting operation of FIG. 10e prior to removing surface 218 by CMP. CMP removes that portion of base material 122 from surface 218 outside node 224 remaining after the cutting operation. The absence of an encapsulant/base material interface at the CMP level by virtue of notch 224 around a peripheral region of molded substrate eliminates or reduces the TTV issues noted in the background where the etch rate of the mold compound and the base material adjacent to the mold compound is typically less than the base material away from the molding compound. Molded substrate 160 exhibits less of or even eliminates the dishing effect from TTV and reduces the reliability issues in which certain conductive TSVs are revealed earlier or later depending on the wafer thickness, as discussed in the background.

Instead, conductive TSVs 132 are revealed during the final CMP stage of a multi-step thinning process involving backgrinding of opposite surfaces in FIGS. 10b-10c, edge trimming in FIG. 10e, and CMP in FIG. 10g to reduce or eliminate TTV particularly at the edges of semiconductor wafer 120. Surface 222 of encapsulant 150 is substantially coplanar with surface 226 of base material 122 following CMP to reveal and expose each conductive TSV 132 with the intended electrical continuity. The absence of an encapsulant/base material interface at the CMP level and coplanarity of the molded substrate results in less over-etching or under-etching and fewer defects.

Molded substrate 160 is singulated through saw streets 126 using a saw blade or laser cutting tool to separate individual semiconductor die 124, similar to FIG. 8.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor wafer containing a plurality of semiconductor dies formed in a base material extending across the semiconductor wafer and a plurality of conductive vias formed partially through an active surface of the base material with a distal end of the conductive vias embedded in the base material;
   depositing an encapsulant over the active surface of the base material and around a peripheral region of the semiconductor wafer;
   removing a first portion of the encapsulant and a first portion of the base material from a second surface of the base material opposite the active surface of the base material around the peripheral region to form a notch extending laterally through the encapsulant to remove all of the encapsulant around the perimeter of the semiconductor wafer within a height of the notch and further extending laterally into the base material, wherein the notch terminates prior to the conductive vias to leave the distal end of the conductive vias embedded in the base material; and
   removing a second portion of the base material after forming the notch to remove the notch and expose the distal end of the conductive vias.

2. The method of claim 1, further including removing a third portion of the base material prior to forming the notch.

3. The method of claim 1, further including removing a third portion of the base material after forming the notch without exposing the distal end of the conductive vias.

4. The method of claim 1, further including removing the second portion of the base material by a backgrinding operation.

5. The method of claim 1, further including forming the notch by a laser.

6. The method of claim 1, further including removing a second portion of the encapsulant.

7. A method of making a semiconductor device, comprising:
   providing a semiconductor wafer containing a plurality of semiconductor dies formed in a base material of the semiconductor wafer;
   depositing an encapsulant over an active surface of the base material and around a peripheral region of the semiconductor wafer;
   forming a notch by a laser, wherein the notch extends laterally through a first portion of the encapsulant by removing all of the encapsulant around the perimeter of the semiconductor wafer within a height of the notch and further extends into the base material at a second surface of the base material opposite the active surface of the base material; and
   removing a first portion of the base material to remove the notch and leave the base material coplanar with the encapsulant.

8. The method of claim 7, further including removing a second portion of the base material prior to removing the first portion of the encapsulant around the peripheral region.

9. The method of claim 7, further including removing a second portion of the base material after removing the first portion of the encapsulant around the peripheral region.

10. The method of claim 7, further including removing the first portion of the base material by a backgrinding operation.

11. The method of claim 7, further including removing a second portion of the encapsulant.

12. The method of claim 7, further including providing a plurality of conductive vias extending vertically and partially through the base material.

13. The method of claim 12, wherein removing the first portion of the base material exposes the conductive vias.

14. A method of making a semiconductor device, comprising:
   providing a semiconductor wafer including a plurality of semiconductor dies formed in a base material of the semiconductor wafer;
   depositing an encapsulant around a peripheral region of the semiconductor wafer; and
   forming a notch by a laser, wherein the notch extends laterally through the encapsulant and into the base material at a second surface of the base material opposite an active surface of the base material around the peripheral region.

15. The method of claim 14, further including removing a portion of the base material prior to forming the notch.

16. The method of claim 14, further including removing a portion of the base material to remove the notch and leave the base material coplanar with the encapsulant.

17. The method of claim 14, further including removing a portion of the base material by a backgrinding operation.

18. The method of claim 14, further including removing a portion of the encapsulant.

19. The method of claim 14, further including providing a plurality of conductive vias extending vertically and partially through the base material.

20. The method of claim 19, wherein the notch terminates prior to the conductive vias to leave a distal end of the conductive vias embedded in the base material.

21. A semiconductor device, comprising:
 a semiconductor wafer including a plurality of semiconductor dies formed in a base material of the semiconductor wafer and a conductive via extending from an active surface of the base material partially through the base material; and
 an encapsulant deposited around a peripheral region of the semiconductor wafer with a notch extending laterally through the encapsulant around the peripheral region and into a second surface of the base material opposite the active surface of the base material, wherein the notch terminates prior to the conductive via to leave a distal end of the conductive via embedded in the base material.

22. The semiconductor device of claim 21, wherein the encapsulant is deposited over the active surface of the base material.

23. A method of making a semiconductor device, comprising:
 providing a semiconductor wafer containing a plurality of semiconductor dies formed in a base material of the semiconductor wafer;
 providing a plurality of conductive vias extending vertically and partially through the base material;
 depositing an encapsulant over an active surface of the base material and around a peripheral region of the semiconductor wafer;
 forming a notch extending laterally through a first portion of the encapsulant by removing all of the encapsulant around the perimeter of the semiconductor wafer within a height of the notch, wherein the notch extends into the base material at a second surface of the base material opposite the active surface of the base material and terminates prior to the conductive vias to leave a distal end of the conductive vias embedded in the base material; and
 removing a first portion of the base material to remove the notch and leave the base material coplanar with the encapsulant.

* * * * *